(12) United States Patent
Lin

(10) Patent No.: US 7,816,193 B2
(45) Date of Patent: Oct. 19, 2010

(54) METHOD FOR FABRICATING A PIXEL STRUCTURE OF A LIQUID CRYSTAL DISPLAY

(75) Inventor: Hsiang-Lin Lin, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 546 days.

(21) Appl. No.: 11/964,758

(22) Filed: Dec. 27, 2007

(65) Prior Publication Data
US 2008/0182350 A1    Jul. 31, 2008

(30) Foreign Application Priority Data
Jan. 31, 2007    (TW) ............... 96103508 A

(51) Int. Cl.
H01L 21/84    (2006.01)
(52) U.S. Cl. ............... 438/158; 438/160; 438/958; 257/E21.414
(58) Field of Classification Search ............... 438/30, 438/155, 158, 160, 161, 781, 958; 257/E21.411, 257/E21.414
See application file for complete search history.

(56) References Cited

U.S. PATENT DOCUMENTS 7,098,062 B2 *    8/2006    Shih ............... 438/30
7,638,375 B2 *    12/2009    Chin et al. ............... 438/158
7,687,325 B2 *    3/2010    Yamazaki et al. ........... 438/149
2009/0108260 A1 *    4/2009    Lin et al. ............... 257/59

FOREIGN PATENT DOCUMENTS

CN    1353328    6/2002
CN    1632675    6/2005

OTHER PUBLICATIONS

CN Office Action mailed Jul. 4, 2008.

* cited by examiner

*Primary Examiner*—Tuan N. Quach
(74) *Attorney, Agent, or Firm*—Thomas, Kayden, Horstemeyer & Risley

(57) ABSTRACT

A method for fabricating a pixel structure of a liquid crystal device is provided. The method comprises providing a substrate defining a thin film transistor (TFT) region and a display region thereon. An opaque conductive layer is formed on the TFT region, and a transparent pixel electrode is formed on the display region. A patterned photoresist passivation layer is formed by backside exposure process on the TFT region, wherein the opaque conductive layer serves as the photomask during the backside exposure process. The photoresist passivation layer is subjected to a middle bake process to be reflowed, resulting in a complete covering of the opaque conductive layer.

25 Claims, 11 Drawing Sheets

METHOD FOR FABRICATING A PIXEL STRUCTURE OF A LIQUID CRYSTAL DISPLAY

BACKGROUND OF THE INVENTION

1. Field of the Invention

The invention relates to a method for fabricating a liquid crystal display and more particularly to a method for fabricating a pixel structure of liquid crystal display.

2. Description of the Related Art

Thin film transistors (TFT) drive pixels in active matrix liquid crystal displays, active matrix organic light-emitting displays, image sensors and the like. Generally, TFT used in these apparatuses are formed of silicon semiconductor thin film.

Large area electronic devices (e.g., LCD (liquid crystal display)) typically include large arrays of thin-film transistors (TFTs) for addressing individual elements of the electronic device (e.g., pixels of the displays). As the demand for larger electronic devices, such as LCD displays, continues to rise, the TFT arrays used in these devices must include increasing numbers of TFTs and more complex interconnect structures. In addition, the need for large display devices complicates the fabrication of these devices using conventional semiconductor processes. In combination, these factors result in ever-increasing TFT array size and complexity.

To reduce some of the costs associated with the production of these larger LCD displays, a lift-off process is sometimes used to generate patterned structures that device openings (vias) and gaps between the various structures that make up the TFT array. In a conventional lift-off process, a base layer on which a patterned photoresist layer is formed is blanket-coated with an overlying thin film, typically a metal layer. Then, the patterned photoresist layer is stripped, which removes those portions of the metal layer formed on top of the patterned photoresist layer, leaving a patterned metal layer on the base layer. By eliminating the need for a separate etch process to create the patterned metal layer, the conventional (photoresist-based) lift-off process can simplify the overall production process, thereby reducing production costs. However, patterning the photoresist layer still requires a photolithography process. For cost-reduction purposes, it is generally desirable to minimize the number of photolithography process steps required. This is not only due to the demanding nature of the photolithography process itself, but also due to the time and costs involved in producing the delicate photomasks used in the photolithography process.

Accordingly, what is needed is a method for forming patterned structures for large area electronic devices that does not require the need for photolithographic masks (self-aligned) to save time and reduce fabrication cost. An exposure process technique so-called "back exposure" has been proposed to form desired transparent, colored and fine patterns on a transparent substrate by exposure to light from the back of the substrate with an opaque pattern as photo-mask.

The back exposure, however, needs numerous and complicated preparations. Further, there is no reference that discloses a method to form a passivation layer by back exposure. Therefore, it is necessary to develop a novel method for forming a passivation layer of LCDs by back exposure without increasing process complexity.

BRIEF SUMMARY OF THE INVENTION

An exemplary embodiment a method for fabricating a pixel structure of LCDs comprises: providing a substrate with a predetermined driving element region and a display region; forming a patterned first conductive layer on the substrate to form a gate electrode on the predetermined driving element region of the substrate; sequentially forming a gate dielectric layer, a semiconductor layer, and a second conductive layer on the substrate, and patterning the second conductive layer, the semiconductor layer and the gate dielectric layer to form patterned gate dielectric layer, semiconductor layer, and second conductive layer covering the gate electrode; conformally forming a transparent conductive layer on the patterned second conductive layer and the substrate, and patterning the transparent conductive layer to form a patterned transparent conductive layer covering part of the patterned second conductive layer and the display region of the substrate; etching the patterned second conductive layer over the gate electrode with the patterned transparent conductive layer serving as a mask to form a source electrode and a drain electrode, wherein the source electrode, drain electrode, patterned gate dielectric layer, patterned semiconductor layer, and the gate electrode comprise a thin film transistor (TFT); conformally forming a passivation layer on the TFT and the substrate; and patterning the passivation layer to form a patterned passivation layer on the TFT by back exposure with the patterned first and second conductive layer serving as a mask.

According to another embodiment of the invention, a method for fabricating a pixel structure of LCDs comprises: providing a substrate with a predetermined driving element region and a display region; forming a patterned first conductive layer on the substrate to form a plurality of gate lines, a gate electrode on the predetermined driving element region, a bottom electrode, and a gate contact; sequentially forming a gate dielectric layer, a semiconductor layer, and a second conductive layer on the substrate; patterning the second conductive layer, the semiconductor layer and the gate dielectric layer to form a plurality of data lines perpendicular to the gate lines; a top electrode over the bottom electrode separated by the pattern gate dielectric layer, and a patterned second conductive layer on the gate electrode, wherein the top electrode, bottom electrode, and the gate dielectric layer therebetween comprises a capacitor; conformally forming a transparent conductive layer on the substrate; patterning the transparent conductive layer to form a patterned transparent conductive layer on the patterned second conductive layer; a pixel electrode on the display region, and a pad electrically connected to the gate electrode; etching the patterned second conductive layer with the transparent conductive layer serving as a mask to form a source electrode and a drain electrode, wherein the source electrode, drain electrode, gate dielectric layer, patterned semiconductor layer, and the gate electrode comprises a thin film transistor (TFT); conformally forming a passivation layer on the substrate; and patterning the passivation layer to form a patterned passivation layers on the TFT, the capacitor, and a part of the gate contact by back exposure with the patterned first and second conductive layer serving as a mask.

An exemplary embodiment of a method for fabricating a pixel structure of LCDs comprises the following steps. A substrate with a predetermined driving element region and a display region is provided. A patterned opaque conductive layer is formed on the predetermined driving element region of the substrate and a transparent pixel electrode is simultaneously formed on the display region of the substrate. A photoresist passivation layer is formed on the substrate. The photoresist passivation layer is patterned by back exposure to form a patterned photoresist passivation layer on the patterned opaque conductive layer with the patterned opaque conductive layer serving as a mask. The photoresist passivation layer is subjected to a middle bake process to be reflowed, resulting in a complete covering of the patterned opaque conductive layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
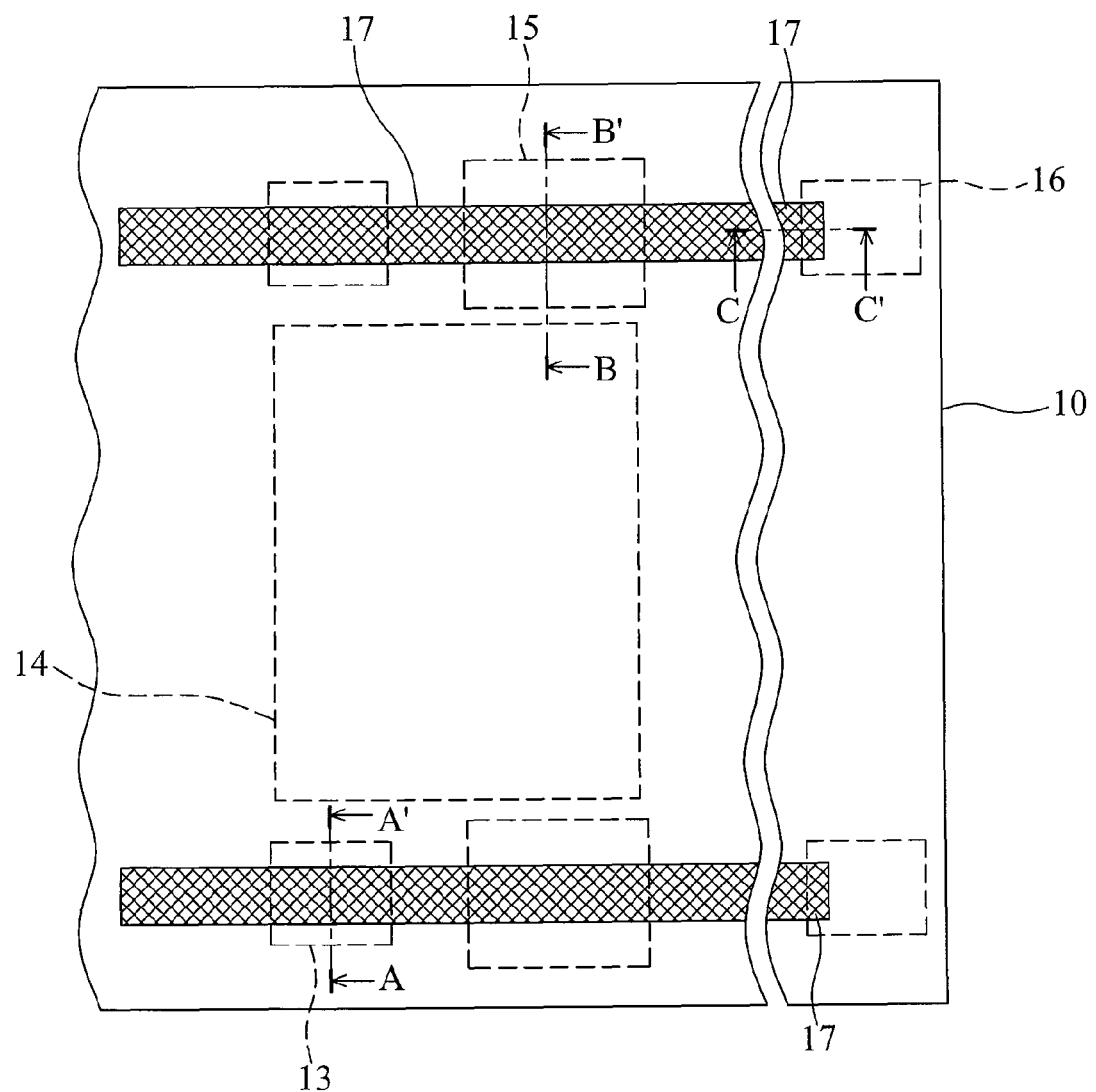
FIGS. 1a-1d are top views of a method for fabricating a pixel structure for LCDs according to an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

FIGS. 1a-1d are top views of a method for fabricating a pixel structure for LCDs according to an embodiment of the invention, and FIGS. 2a to 2i are sectional diagrams of FIGS. 1a-1d along lines A-A', B-B' and C-C', showing the method for fabricating electroluminescent devices.

A substrate 10 with a first surface 11 and a second surface 12 is provided, wherein the substrate 10 has a predetermined driving element region 13, a display region 14, a predetermined capacitor region 15, and a peripheral pad region 16. FIG. 2a is sectional diagram of FIG. 1a along lines A-A', B-B' and C-C', respectively showing the fabrication method of driving element (thin film transistor (TFT)), storage capacitor, and electrode pad. Referring to FIG. 1, a first conductive layer (not shown) is formed on the substrate 10 and patterned to form a plurality of gate lines 17, wherein the gate lines can be categorized by function into a gate electrode 18 on the predetermined driving element region 13, a bottom electrode 19 on the predetermined capacitor region 15, a gate line contact 20 on the peripheral pad region 16. The substrate can be a transparent substrate or plastic substrate, and the first conductive layer can be titanium (Ti), molybdenum (Mo), tungsten (W), aluminum (Al), copper (Cu), silver (Ag), a multi-layer or alloy thereof.

Figure 1B:
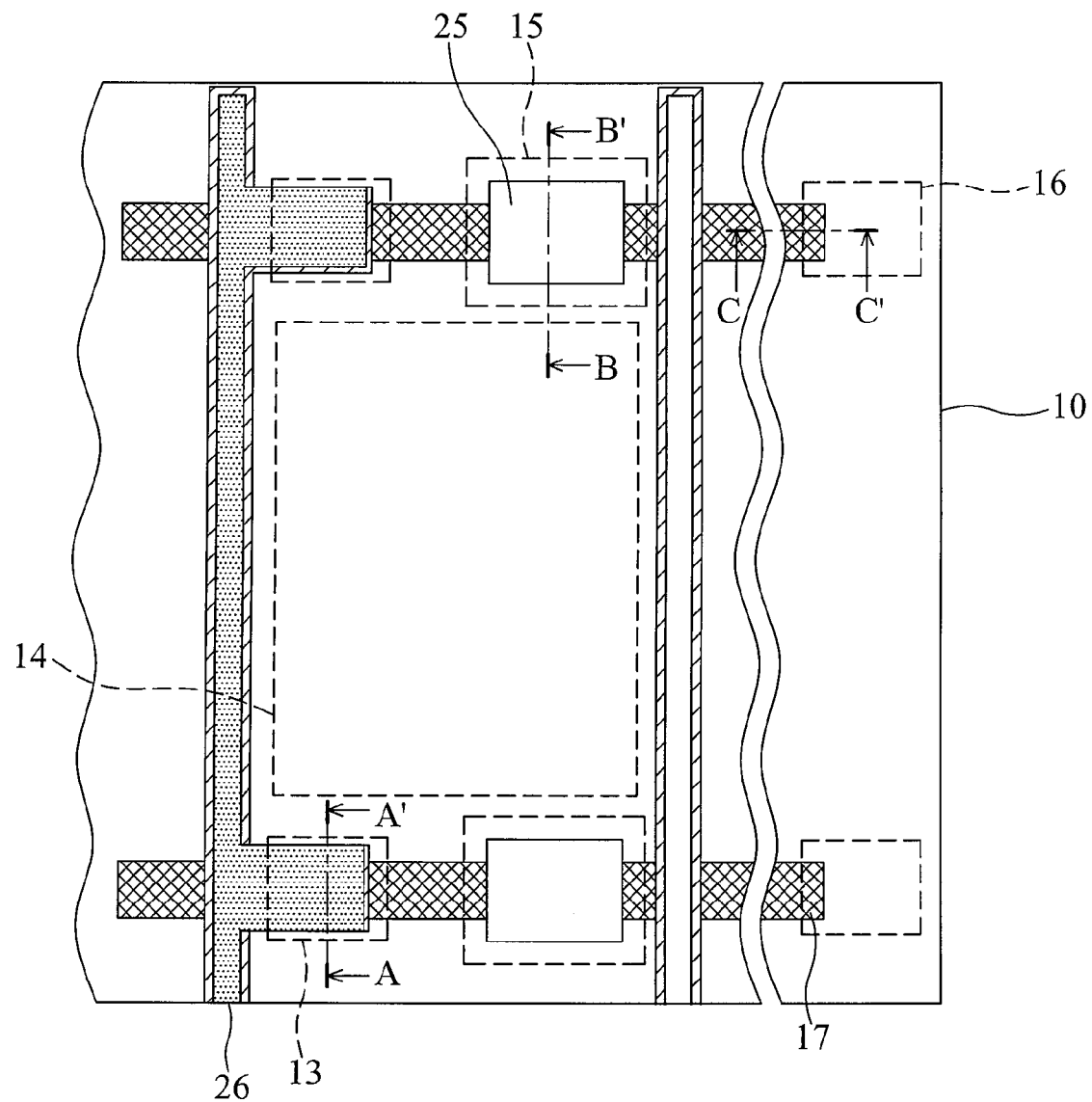
Figure 1C:
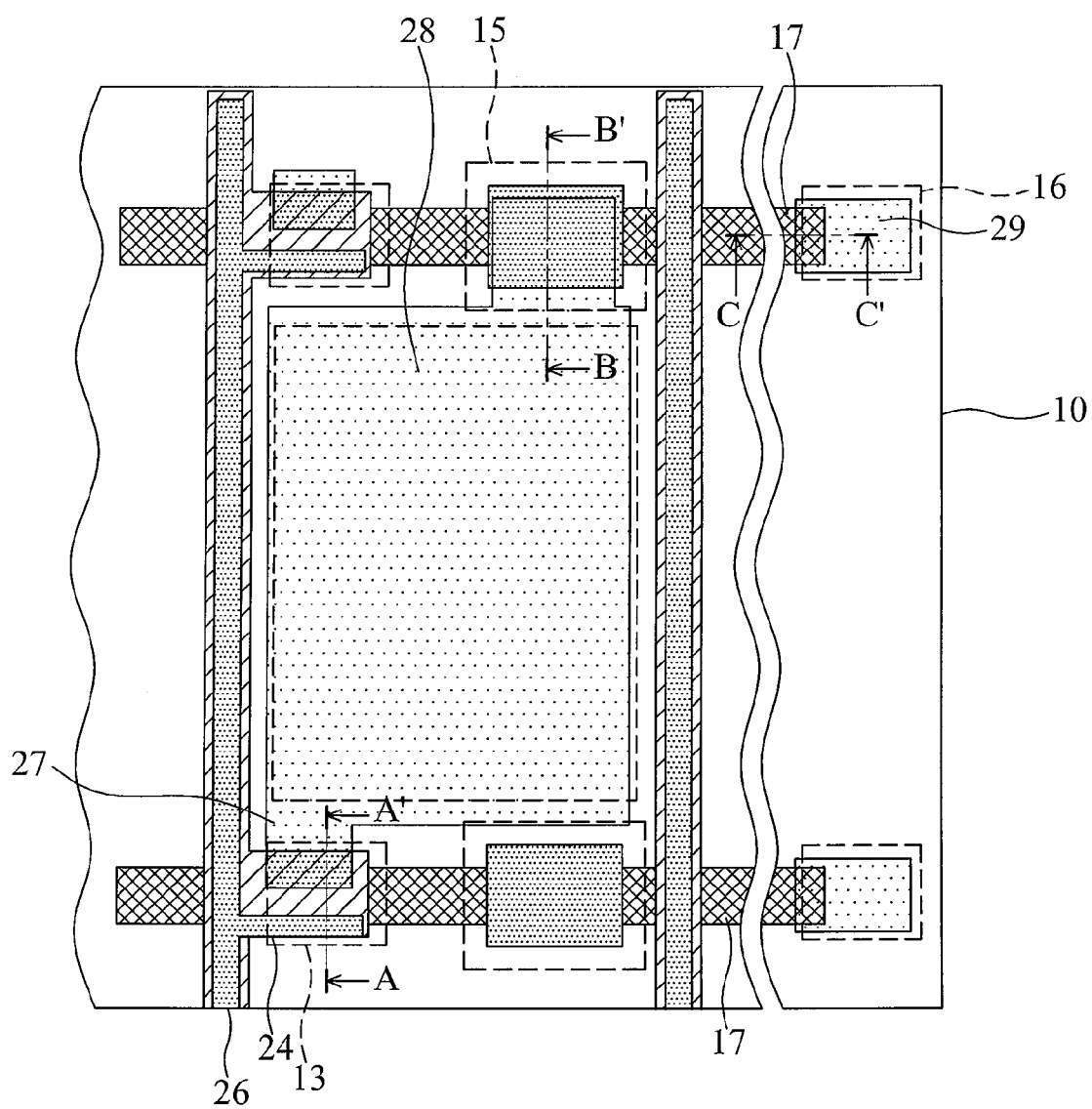
Figure 1D:
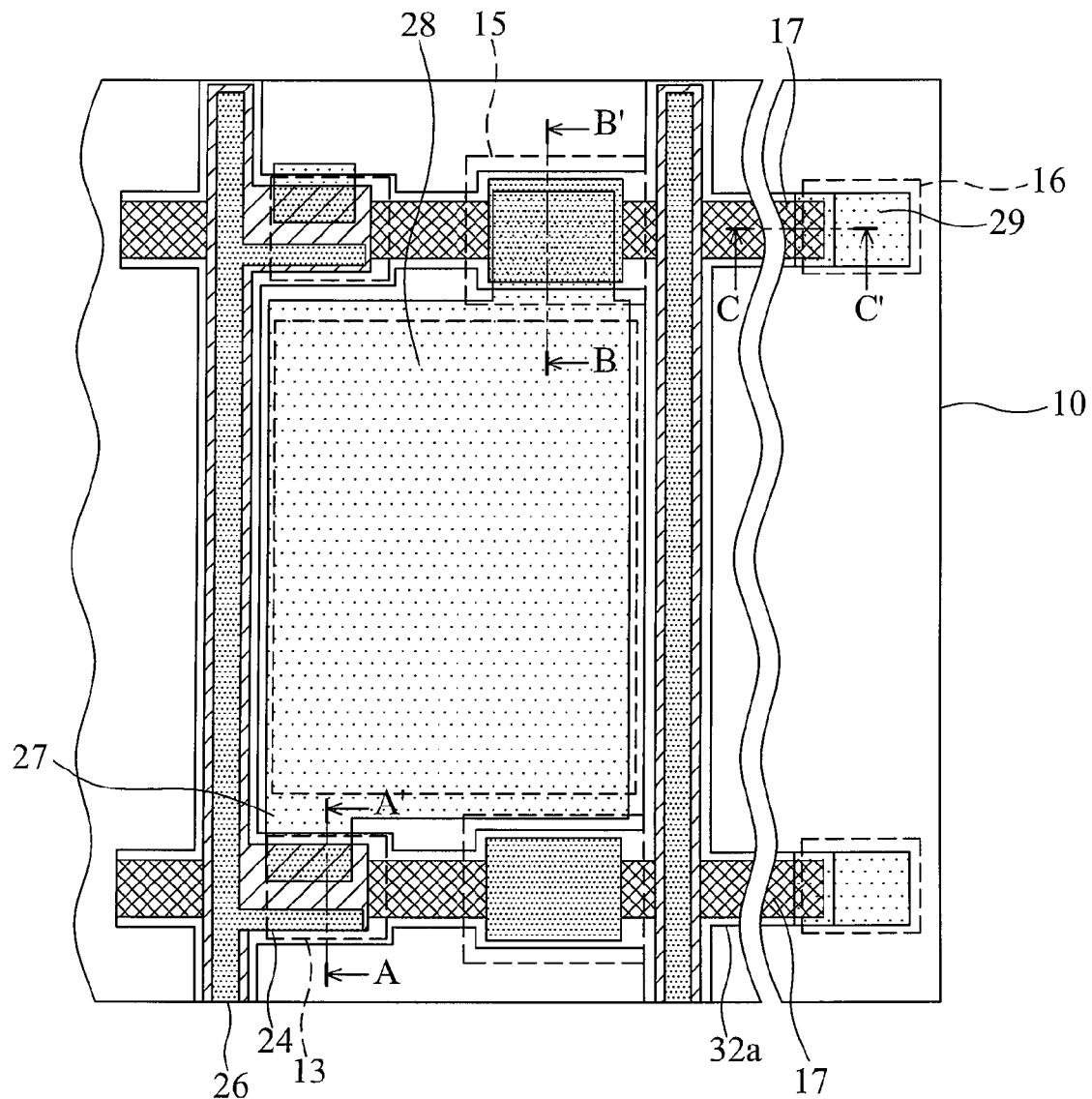
Figure 2A:
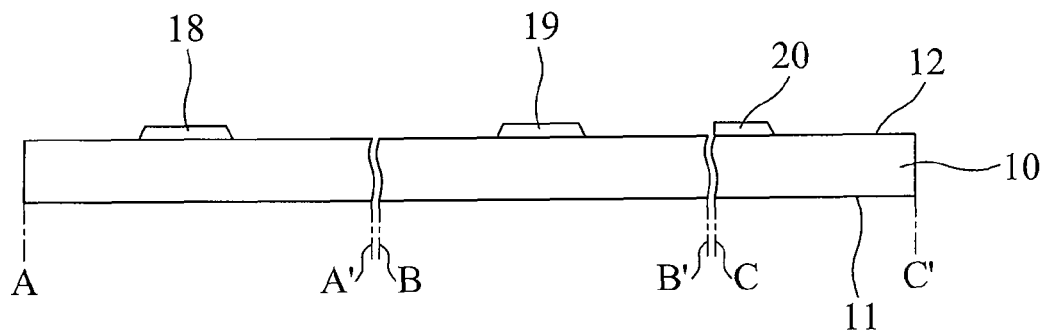
FIGS. 2a-2i are sectional diagrams of FIGS. 1a-1d along lines A-A', B-B', and C-C' showing the method for fabricating a pixel structure of LCDs according to an embodiment of the invention.
Figure 2B:
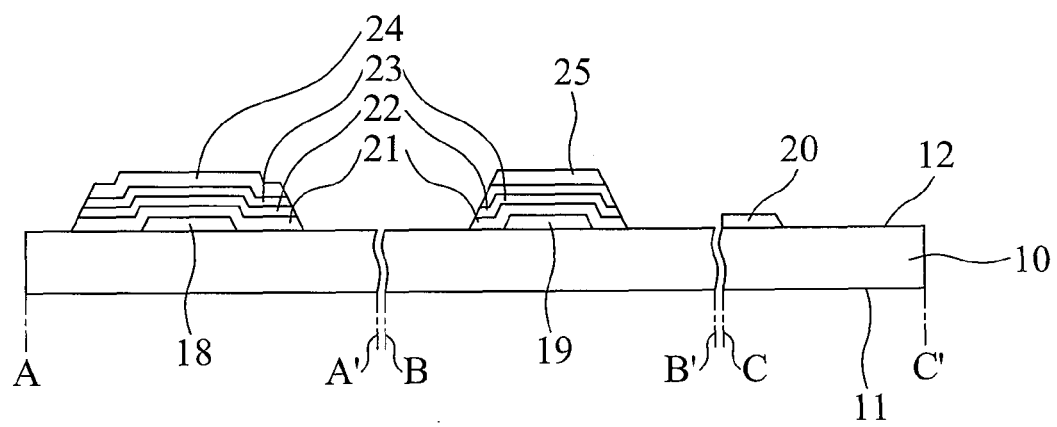

Next, referring to FIG. 1b and 2b, FIG. 1b and 2b show a gate dielectric layer, a semiconductor layer, an ohmic contact layer, and a second conductive layer on a substrate. The second conductive layer is patterned to form a plurality of data lines 26 and a top electrode 25 is formed on the predetermined capacitor region 15, wherein the plurality of data lines 26 comprises a patterned second conductive layer 24 formed on the predetermined driving element region 13. The ohmic contact layer, semiconductor layer, and gate dielectric layer are simultaneously patterned to form a patterned ohmic contact layer 23, a patterned semiconductor layer 22, and a gate dielectric layer 21 on the predetermined driving element region 13 and predetermined capacitor region 15. Particularly, the bottom electrode 19, the top electrode 25, and gate dielectric layer 21 formed therebetween comprise a storage capacitor. The ohmic contact layer 23 can be a N+ type doping ohmic contact layer. The gate dielectric layer can be a dielectric material, such as silicon oxide, or silicon nitride. The semiconductor layer 22 can be a polysilicon, or amorphous silicon. Further, the semiconductor layer can be a doped semiconductor layer. The gate dielectric layer 21, semiconductor layer 22, ohmic contact layer 23 and second conductive layer are patterned by the same photo-mask and the same etching process.

Figure 2C:
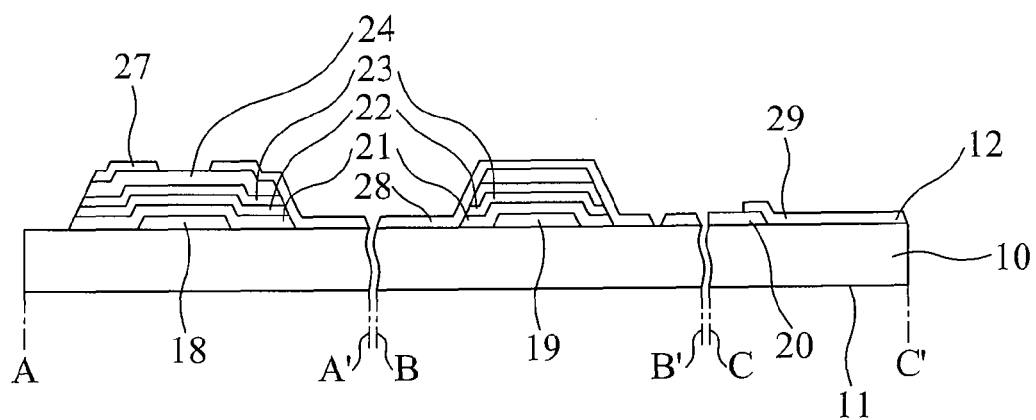
Figure 2D:
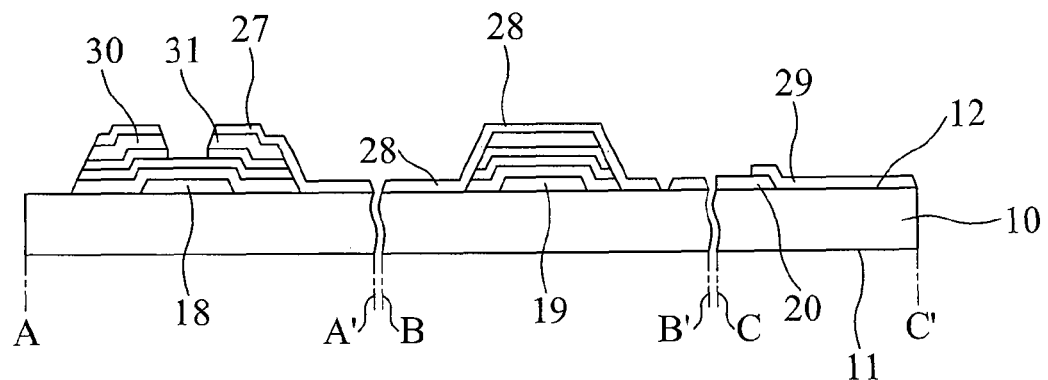

Next, referring to FIG. 2c, a transparent conductive layer is conformally formed on the substrate 10, and the transparent conductive layer is patterned to form a patterned transparent conductive layer 27 on the patterned second conductive layer 24, a pixel electrode 28 on the display region 14, and a pad 29 electrically connects to the gate line contact 20. Next, referring to FIGS. 1c and 2d, the patterned second conductive layer 24 is etched to form a source electrode 30 and a drain electrode 31 with the patterned transparent conductive layer 27 serving as a mask. The source electrode 30, drain electrode 31, patterned gate dielectric layer 21, semiconductor layer 22, and the gate electrode 18 comprise a thin film transistor (TFT). Specifically, the aforementioned etching process is a self-alignment etching process.

Figure 2E:
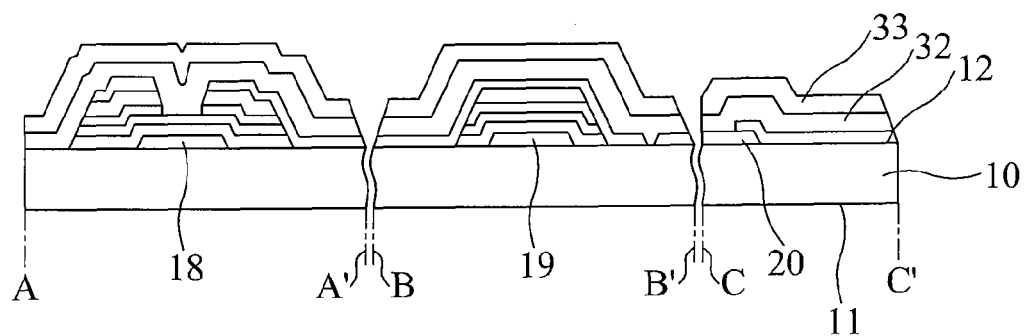

Next, referring to FIG. 2e, a transparent passivation layer 32 and a photoresist passivation layer 33 (such as a positive photoresist layer) are conformally formed on the substrate 10. Next, the photoresist passivation layer 33 is patterned by back exposure (light incident from the side of the first surface 11) with the first and second conductive layer (gate lines 17, data lines 26, source electrode 30, drain electrode 31, gate electrode 18, top electrode 25, bottom electrode 19, and gate line contact 20) serving as a mask, referring to FIG. 2f. The transparent passivation layer 32 can be a silicon nitride or silicon oxide.

Figure 2F:
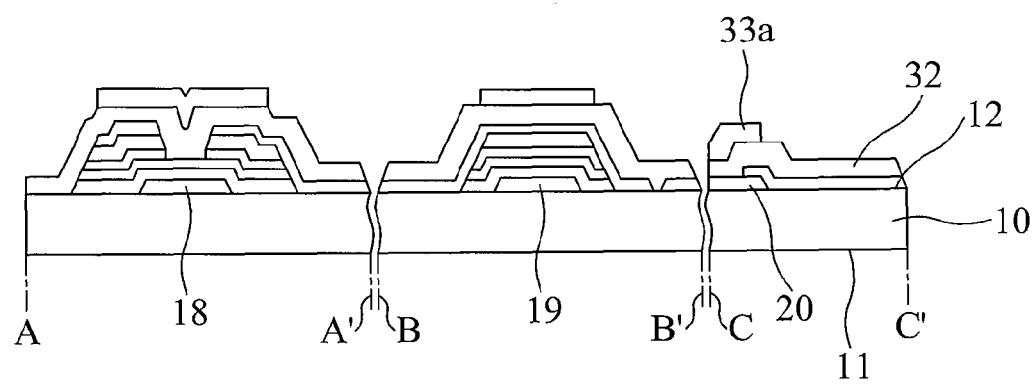
Figure 2G:
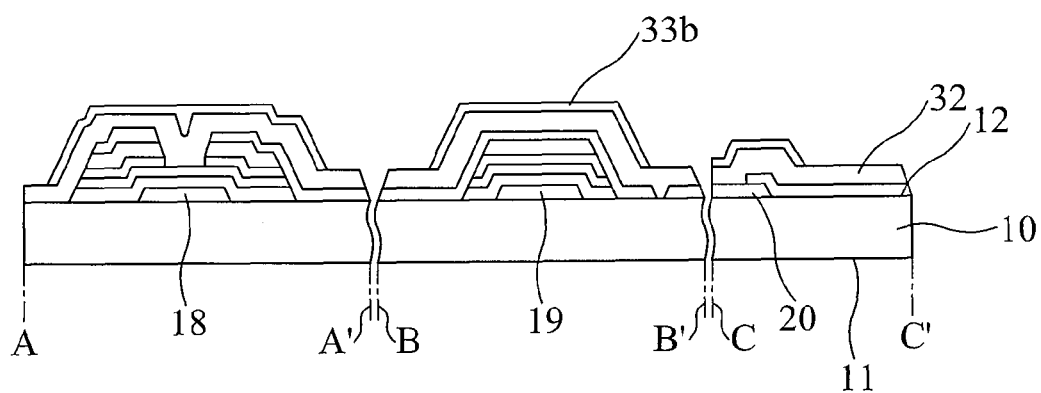

Still referring to FIG. 2f, since the photoresist passivation layer 33 is a positive photoresist layer, the exposed photoresist passivation layer is removed and the unexposed photoresist passivation layer 33a remains. It should be noted that the patterned photoresist passivation layer 33a is subjected to a middle bake process to be reflowed. Referring to FIG. 2g, the plane area of the reflowed photoresist passivation layer 33b is larger than that of the patterned photoresist passivation layer 33a.

Figure 2H:
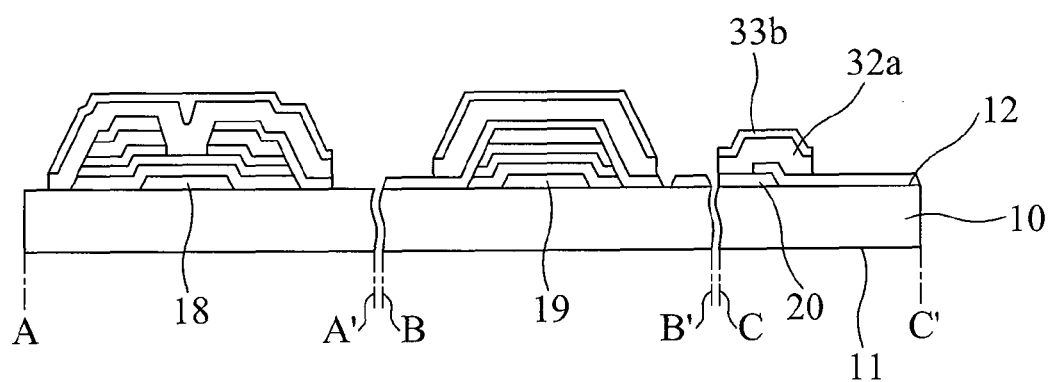
Figure 2I:
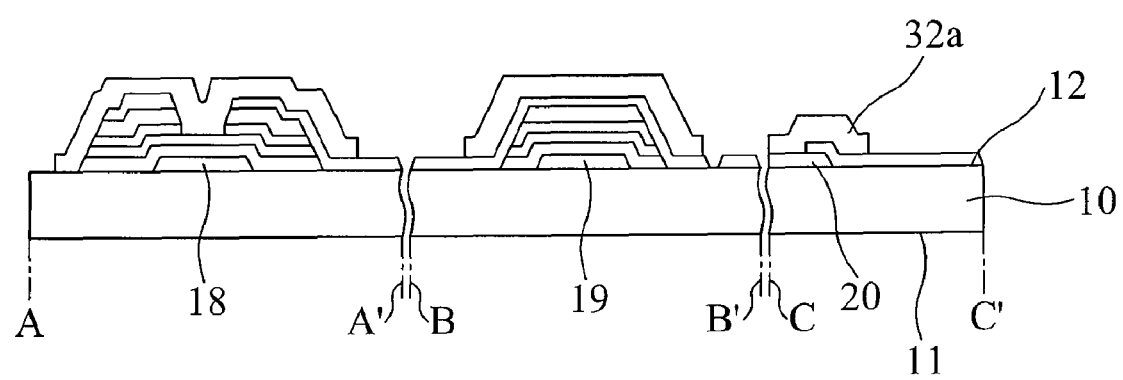

Referring to FIG. 2h, the transparent passivation layer 32 is patterned with the reflowed photoresist passivation layer 33b serving as a mask to form a patterned transparent passivation layer 32a completely covering the thin film transistor (TFT) and the storage capacitor. It should be noted that the plane area of the patterned passivation layer 32a is also larger than that of the back exposure mask (the first and second conductive layer). Next, referring to FIGS. 1d and 2i, the reflowed photoresist passivation layer 33b is removed, thus fabrication of a pixel structure for LCDs is completed, requiring only four photolithography steps according to the embodiment. Specifically, one of the four photolithography steps is a back exposure process to form the passivation layer, thereby avoiding alignment errors and improving yield and increasing throughput.

Figure 3A:
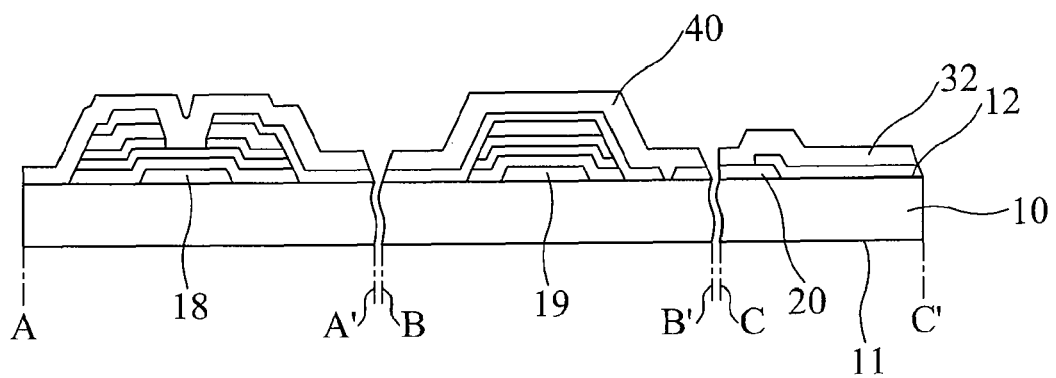
FIGS. 3a-3c are cross sections of a method for fabricating a pixel structure for LCDs according to another embodiment of the invention.
Figure 3B:
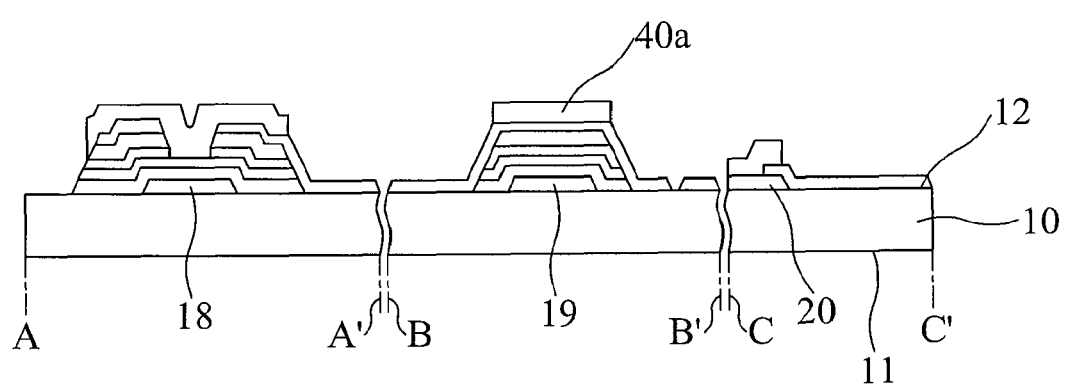
Figure 3C:
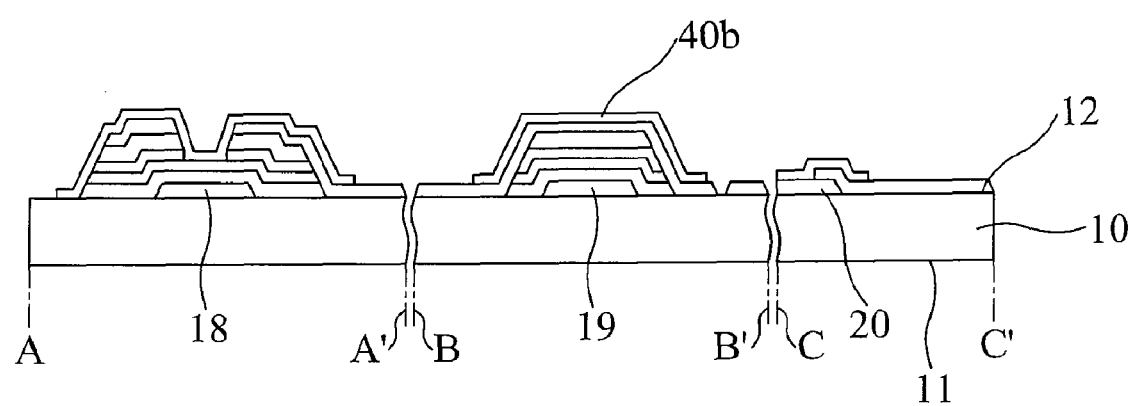

According to another embodiment of the present invention, the passivation layer can also be a positive photoresist layer. Referring to FIG. 3a, after completing the process as described in FIG. 2d, a positive photoresist passivation layer 40 is formed on the substrate 10. Next, positive photoresist passivation layer 40 is patterned with the first and second conductive layer (gate lines 17, data lines 26, source electrode 30, drain electrode 31, gate electrode 18, top electrode 25, bottom electrode 19, and gate line contact 20) serving as a mask, forming a patterned positive photoresist passivation layer 40a, referring to FIG. 3b. Next, referring to FIG. 3c, the patterned positive photoresist passivation layer 40a is subjected to a middle bake process to be reflowed. It should be noted that the plane area of the reflowed positive photoresist passivation layer 40b is larger than that of the back exposure mask (gate lines 17, data lines 26, source electrode 30, drain electrode 31, gate electrode 18, top electrode 25, bottom electrode 19, and gate line contact 20).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a pixel structure for LCDs, comprising:
    providing a substrate with a predetermined driving element region and a display region;
    forming a patterned first conductive layer on the substrate to form a gate electrode on the predetermined driving element region of the substrate;
    sequentially forming a gate dielectric layer, a semiconductor layer, and a second conductive layer on the substrate, and patterning the second conductive layer, the semiconductor layer and the gate dielectric layer to form patterned gate dielectric layer, semiconductor layer, and second conductive layer covering the gate electrode;
    conformally forming a transparent conductive layer on the patterned second conductive layer and the substrate and patterning the transparent conductive layer to form a patterned transparent conductive layer covering part of the patterned second conductive layer and the display region of the substrate;
    etching the patterned second conductive layer over the gate electrode with the patterned transparent conductive layer serving as a mask to form a source electrode and a drain electrode, wherein the source electrode, drain electrode, patterned gate dielectric layer, patterned semiconductor layer, and the gate electrode construct a thin film transistor (TFT);
    conformally forming a passivation layer on the TFT and the substrate; and
    patterning the passivation layer to form a patterned passivation layer on the TFT by back exposure with the patterned first and second conductive layer as mask.

2. The method as claimed in claim 1, wherein after forming the semiconductor layer, further comprising an ohmic contact layer directly formed on the semiconductor layer.

3. The method as claimed in claim 2, wherein the ohmic contact layer comprises a N$^+$ type doping ohmic contact layer.

4. The method as claimed in claim 1, wherein the patterned transparent conductive layer within the display region serves as a pixel electrode.

5. The method as claimed in claim 1, wherein the substrate comprises a transparent glass substrate or a plastic substrates.

6. The method as claimed in claim 1, wherein the passivation layer comprises a positive photoresist layer.

7. The method as claimed in claim 6, wherein after patterning the passivation layer, further comprising:
    subjecting the passivation layer to a middle bake process to be reflowed, resulting in complete covering of the TFT.

8. The method as claimed in claim 7, wherein the plane area of the reflowed passivation layer is larger than that of the patterned first and second conductive layer serving as a mask.

9. The method as claimed in claim 1, wherein the passivation layer comprises a transparent material layer.

10. The method as claimed in claim 9, wherein a material of the passivation layer comprises silicon nitride or silicon oxide.

11. The method as claimed in claim 9, wherein the steps of patterning the passivation layer by back exposure comprises:
    forming a positive photoresist layer on the passivation layer;
    patterning the positive photoresist layer with the patterned first and second conductive layer as mask;
    subjecting the patterned positive photoresist layer to a middle bake process to be reflowed; and
    patterning the passivation layer with the reflowed positive photoresist layer serving as a mask to form a patterned passivation layer covering the TFT; and
    removing the positive photoresist layer.

12. The method as claimed in claim 11, wherein the plane area of the patterned passivation layer is larger than that of the patterned first and second conductive layer serving as a mask.

13. A method for fabricating a pixel structure for LCDs, comprising:
    providing a substrate with a predetermined driving element region and a display region;
    forming a patterned first conductive layer on the substrate to form a plurality of gate lines, a gate electrode on the predetermined driving element region, a bottom electrode, and a gate contact;
    sequentially forming a gate dielectric layer, a semiconductor layer, and a second conductive layer on the substrate;
    patterning the second conductive layer, the semiconductor layer and the gate dielectric layer to form a plurality of data lines perpendicular to the gate lines, a top electrode over the bottom electrode separated by the patterned gate dielectric layer, and a patterned second conductive layer on the gate electrode, wherein the top electrode, bottom electrode, and the gate dielectric layer therebetween comprises a capacitor;
    conformally forming a transparent conductive layer on the substrate;
    patterning the transparent conductive layer to form a patterned transparent conductive layer on the patterned second conductive layer, a pixel electrode on the display region, and a pad electrically connecting to the gate electrode;
    etching the patterned second conductive layer with the transparent conductive layer serving as a mask to form a source electrode and a drain electrode, wherein the source electrode, drain electrode, gate dielectric layer, patterned semiconductor layer, and the gate electrode construct a thin film transistor (TFT);
    conformally forming a passivation layer on the substrate; and
    patterning the passivation layer to form patterned passivation layers on the TFT, the capacitor, and part of the gate contact by back exposure with the patterned first and second conductive layer serving as a mask.

14. The method as claimed in claim 13, wherein after patterning the passivation layer, further comprising:
    subjecting the passivation layer to a middle bake process to be reflowed, resulting in complete covering of the TFT and the capacitor.

15. The method as claimed in claim 14, wherein the plane area of the reflowed passivation layer is larger than that of the patterned first and second conductive layer serving as a mask.

16. The method as claimed in claim 13, wherein the steps of patterning the passivation layer by back exposure comprises:
   forming a positive photoresist layer on the passivation layer;
   patterning the positive photoresist layer with the patterned first and second conductive layer serving as a mask;
   subjecting the patterned positive photoresist layer to a middle bake process to be reflowed; and
   patterning the passivation layer with the reflowed positive photoresist layer serving as a mask to form a patterned passivation layer covering the TFT and the capacitor; and
   removing the positive photoresist layer.

17. The method as claimed in claim 16, wherein the plane area of the patterned passivation layer is larger than that of the patterned first and second conductive layer serving as a mask.

18. A method for fabricating a pixel structure of LCDs, comprising:
   providing a substrate with a predetermined driving element region and a display region;
   forming a patterned opaque conductive layer on the predetermined driving element region of the substrate and simultaneously forming a transparent pixel electrode on the display region of the substrate;
   forming a photoresist passivation layer on the substrate;
   patterning the photoresist passivation layer by back exposure to form a patterned photoresist passivation layer on the patterned opaque conductive layer with the patterned opaque conductive layer serving as a mask; and
   subjecting the photoresist passivation layer to a middle bake process to be reflowed, resulting in complete covering of the patterned opaque conductive layer.

19. The method as claimed in claim 18, wherein the steps for forming a patterned opaque conductive layer on the predetermined driving element region of the substrate and simultaneously forming a transparent pixel electrode on the display region of the substrate comprise:
   forming a first conductive layer on the substrate;
   patterning the first conductive layer to form a gate electrode on the predetermined driving element region of the substrate;
   sequentially forming a gate dielectric layer, a semiconductor layer, and a second conductive layer on the substrate, and patterning the second conductive layer, the semiconductor layer and the gate dielectric layer to form patterned gate dielectric layer, semiconductor layer, and second conductive layer covering the gate electrode;
   conformally forming a transparent conductive layer on the patterned second conductive layer and the display region of substrate;
   patterning the transparent conductive layer;
   further patterning the patterned second conductive layer with the patterned transparent conductive layer serving as a mask to form a source electrode and a drain electrode, wherein the source electrode, drain electrode, patterned gate dielectric layer, patterned semiconductor layer, and the gate electrode comprise a thin film transistor (TFT), and the patterned transparent conductive layer on the display region serves as a pixel electrode.

20. The method as claimed in claim 18, wherein the photoresist passivation layer comprises a positive photoresist layer.

21. The method as claimed in claim 18, wherein the plane area of the reflowed photoresist passivation layer is larger than that of the patterned opaque conductive layer serving as a mask.

22. The method as claimed in claim 18, wherein before forming a photoresist passivation layer on the substrate, further comprising forming a transparent passivation layer on the substrate.

23. The method as claimed in claim 22, wherein a material of the transparent passivation layer comprises silicon nitride and silicon oxide.

24. The method as claimed in claim 22, wherein the steps of patterning the transparent passivation layer by back exposure comprises:
   forming the photoresist passivation layer on the transparent passivation layer;
   patterning the photoresist passivation layer with the patterned opaque conductive layer as mask;
   subjecting the patterned photoresist passivation layer to a middle bake process to be reflowed; and
   patterning the transparent passivation layer with the reflowed photoresist passivation layer as mask to form a patterned transparent passivation layer completely covering the opaque conductive layer; and
   removing the passivation layer photoresist layer.

25. The method as claimed in claim 24, wherein the plane area of the transparent passivation layer is larger than that of the patterned opaque conductive layer serving as mask.

* * * * *